US010775531B2

(12) United States Patent
Walters et al.

(10) Patent No.: US 10,775,531 B2
(45) Date of Patent: Sep. 15, 2020

(54) BIG DATA POINT AND VECTOR MODEL

(71) Applicant: Halliburton Energy Services, Inc., Houston, TX (US)

(72) Inventors: Harold Grayson Walters, Tomball, TX (US); Ronald Glen Dusterhoft, Katy, TX (US); Jeffrey Marc Yarus, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 353 days.

(21) Appl. No.: 15/755,829

(22) PCT Filed: Nov. 3, 2015

(86) PCT No.: PCT/US2015/058748
§ 371 (c)(1),
(2) Date: Feb. 27, 2018

(87) PCT Pub. No.: WO2017/058267
PCT Pub. Date: Apr. 6, 2017

(65) Prior Publication Data
US 2018/0329113 A1    Nov. 15, 2018

Related U.S. Application Data (63) Continuation of application No. PCT/US2015/052949, filed on Sep. 29, 2015.

(51) Int. Cl.
*G01V 1/40* (2006.01)
*G01V 99/00* (2009.01)
(Continued)

(52) U.S. Cl.
CPC ............ *G01V 99/005* (2013.01); *E21B 43/00* (2013.01); *E21B 47/00* (2013.01); *E21B 47/024* (2013.01);
(Continued)

(58) Field of Classification Search
None
See application file for complete search history.

(56) References Cited

U.S. PATENT DOCUMENTS

| 6,631,563 B2* | 10/2003 | Brosnahan | ............ E21B 47/022 33/304 |
| 8,805,654 B2* | 8/2014 | Yarus | ...................... G06F 17/00 703/2 |

(Continued)

OTHER PUBLICATIONS

International Search Report and Written Opinion issued in related PCT Application No. PCT/US2015/058748 dated Jun. 29, 2016, 12 pages.

(Continued)

*Primary Examiner* — Aditya S Bhat
(74) *Attorney, Agent, or Firm* — John W. Wustenberg; Baker Botts L.L.P.

(57) ABSTRACT

Systems and methods for generating and storing measurements in point and vector format for a plurality of formations of reservoirs. In one embodiment, the methods comprise generating a set of measurements corresponding to a plurality of formations, reservoirs, or wellbores; determining physical locations for the set of measurements, wherein the physical locations are represented in a point and vector representation; associating the vector representations with the determined physical locations, wherein the vector representations comprise at least a magnitude and a direction derived from the measurement; wherein the magnitude and direction tracks the physical location in space and time; manipulating the set of measurements such that a change in physical location is updated in the vector representation; generating a repository of vector representations accessible to determine an optimal completion design for a set of parameters for a subterranean formation.

22 Claims, 6 Drawing Sheets

(51) Int. Cl.
*E21B 43/00* (2006.01)
*E21B 47/00* (2012.01)
*E21B 47/024* (2006.01)
*E21B 49/00* (2006.01)
*E21B 49/08* (2006.01)
*G06F 30/20* (2020.01)

(52) U.S. Cl.
CPC .............. *E21B 49/00* (2013.01); *E21B 49/08* (2013.01); *G06F 30/20* (2020.01)

(56) References Cited

U.S. PATENT DOCUMENTS

| | | |
|---|---|---|
| 2003/0121657 A1 | 7/2003 | Chia et al. |
| 2003/0128032 A1 | 7/2003 | Heaton et al. |
| 2006/0055403 A1 | 3/2006 | Freedman |
| 2010/0004867 A1* | 1/2010 | Zhou ........................ G01V 5/12 702/8 |
| 2013/0204534 A1 | 8/2013 | Anand et al. |

OTHER PUBLICATIONS

International Preliminary Report on Patentability issued in related PCT Application No. PCT/US2015/058748 dated Apr. 12, 2018 (8 pages).

\* cited by examiner

| Location | Permeability | Fracture Closure | Resistivity | Init. Production |
|---|---|---|---|---|
| $X_1/Y_1/Z_1$ | $r_{11}/\phi_{11}$ | $r_{21}/\phi_{21}$ | $r_{31}/\phi_{31}$ | $r_{41}/\phi_{41}$ |
| $X_2/Y_2/Z_2$ | $r_{12}/\phi_{12}$ | $r_{22}/\phi_{22}$ | $r_{32}/\phi_{32}$ | $r_{42}/\phi_{42}$ |
| $X_n/Y_n/Z_n$ | $r_{1n}/\phi_{1n}$ | $r_{2n}/\phi_{2n}$ | $r_{3n}/\phi_{3n}$ | $r_{4n}/\phi_{4n}$ |

$r_{11}/\phi_{11}:x_1/y_1/z_1; r_{12}/\phi_{12}:x_2/y_2/z_2; r_{1n}/\phi_{1n}:x_n/y_n/z_n$

BIG DATA POINT AND VECTOR MODEL

CROSS-REFERENCE TO RELATED APPLICATIONS

The present application is a U.S. National Stage Application of International Application No. PCT/US2015/058748 filed Nov. 3, 2015 which claims priority to PCT Application No. PCT/US2015/052949, entitled "Big Data Point and Vector Model" filed Sep. 29, 2015, both of which are incorporated herein by reference in their entirety for all purposes.

BACKGROUND

The present disclosure relates generally to wellbore and completion design operations and, more particularly, to data storage and modeling for well planning, drilling and completion operations.

Hydrocarbons, such as oil and gas, are produced from subterranean reservoir formations that may be located onshore or offshore. The processes involved in recovering hydrocarbons from a reservoir are becoming increasingly complex. Subterranean production is a highly expensive and extensive endeavor and the industry generally relies heavily upon educated predictions of reservoir conditions to characterize the reservoir prior to making substantial investments to optimize well placement within the reservoir, optimize production of hydrocarbons, and performing the necessary steps to produce, process and transport the hydrocarbons from the reservoir.

Planning for and performing the production steps generally requires the manipulation of large amount of information and generation of design and uncertainty modeling tasks. Simulators that predict the manner for developing a design or modeling of reservoirs are separately maintained such that no information is traditionally shared between individual simulations associated with a particular reservoir analysis. For example, planning for a drilling operation may include retrieving information from a relational database and generating relational models that represent the characteristics of the subterranean formation to use to base the wellbore and completion design. These simulations can provide an output with an uncertainty for various manners of design and can be utilized by reservoir engineers to make a number of observations and predictions about, for example, the multiphase flow of oil, gas, and water in a subterranean reservoir. Engineers can further simulate various wellbore and completion designs based on the various uncertainty models to determine one or more improved or optimal location and design of the wellbore to optimize the recoveries of such resources. These are not the only types of parameters taken into account in building a completion design.

Typical relational databases and models are complex and difficult to tie together to cover multiple reservoirs. For instance, the data within the relational database is generally tied to gridded reservoir volumes within the formation in which the data was generated. The relational models are generated from this data, making it difficult to generalize the data outside of the formation in which it was generated. Additionally, different measurements for the same formation may be stored in different databases, so that different databases must be queried to extract properties of the formation.

BRIEF DESCRIPTION OF THE DRAWING(S)

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION OF THE DISCLOSURE

Illustrative embodiments of the present disclosure are described in detail herein. In the interest of clarity, not all features of an actual implementation may be described in this specification. It will of course be appreciated that in the development of any such actual embodiment, numerous implementation-specific decisions are made to achieve the specific implementation goals, which will vary from one implementation to another. Moreover, it will be appreciated that such a development effort might be complex and time-consuming, but would, nevertheless, be a routine undertaking for those of ordinary skill in the art having the benefit of the present disclosure.

To facilitate a better understanding of the present disclosure, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. But in no way are the embodiments limited to such applications.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such as wires, optical fibers, microwaves, radio waves, and other electromagnetic and/or optical carriers; and/or any combination of the foregoing.

The terms "couple" or "couples" as used herein are intended to mean either an indirect or a direct connection. Thus, if a first device couples to a second device, that connection may be through a direct connection, or through an indirect mechanical, electromagnetic, or electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

In one embodiment, the disclosure herein is applicable to develop an improved completion design for a reservoir operation. Data from multiple sources can be sent to a data warehouse for central housing and analysis. The output from the simulation model can also be used to do analytics for further analysis. For example, when a set of parameters are available for a well, an engineer can perform analytics by generating various queries and match the resulting values.

In another embodiment, actual production data resulting from the completed well design and build can be used to self-validate the simulation models generated and stored at the central repository. With the implementation, an engineer could identify rapidly which simulation design would give an optimized production. The results can be further calibrated based on the simulation models. The well-design can be further optimized based on predictive tools and production data.

Because the central repository may take simulation models from a multitude of sources and self-validate the simulation designs, engineers can identify statistics based models to predict efficiently and rapidly. In another embodiment, simulations may not need to be run to identify the optimized well-design. This could further be used to determine physics based models.

Uncertainly based models could take days to run but with the present invention, a central repository could be used to immediately and instantly identify the optimized completion solution for a set of parameters.

By linking the input and output and relating the data back to physics based models, a self-validation may occur to determine the optimized solution for a set of parameters at a multitude of depths. Data could be further fed back in to generate improved and optimized design solutions.

Once the statistical models reach a sufficient degree of efficiency and results, those models can be run in various client offices using remote applications to the data warehouse. Prior to the disclosure herein, in statistical models, an engineer looks to measures in the field. For example, one such measurement may be that if more fluid is pumped at a certain level, more hydrocarbons will be produced from the subterranean formation.

With the present embodiment, the disclosure replaces physics based models with statistics based models to make the central repository a continuously growing and representative database.

With the implementation, instead of iterating to identify a potential design implementation to begin a design, an engineer can begin with a near optimal solution with a level of confidence. This would allow a central repository to have a data store that allows capturing of an engineer's years of experience and reliability in identifying solutions with a repository to use that has self-validated results to develop the optimized completion solution.

Because such models storing the type of data in a central repository can become computationally overwhelming and intensive, the proposed solution herein is ideal for storage of such properties. Geo-cellular models do not handle faults or other identification well. The format is not compatible with performing calculations based on the data. But by assigning points and vectors such as proposed herein to assign properties in point and space removes the need to tie the data to a particular format. Points in space eliminate the problems with prior storage of data and would allow even microseismic data and points to be stored.

Data is traditionally stored by identifying a fixed design size and shape with a fixed volume. To change data for better resolution or to insert more microseismic data, the design process needs to change and start the process over. With the point and vector approach provided herein, changes in resolution can occur readily by adding more points in the point and vector model. The data can span thousands of square miles by having larger number of points with no dimension in space. This would further allow for the central repository to store various simulation models across all platforms.

Under this approach, the reservoir characteristics are mapped using the point and vector model for all of the models stored in the central repository. This allows for improved search and interaction with the data. The data is extractable to perform an analysis by taking points and creating an auto-grid for a particular region. This prevents relying on an existing earth model grid done up front, so the grid can be developed to suit the defined purpose. By implementing the point and vector model to the central depository storage, data can be manipulated in ways to provide an optimal approach to completion design. This will allow the addition of uncertainty analysis to the completion design and result in improved ability to manipulate such data.

This approach will further result in allowing skilled and unskilled engineers to understand the uncertainties associated with the operation and implementation of particular wellbore and completion designs. The point and vector model is usable for any type of database related information such as those required to store reservoir characteristics.

Another further implementation may include inserting time as a data point. This can measure, for example, the result of treatment of instantaneous pressure and the measurable output based on the insertion across a span of time. Thus, in addition to spatial coordinates, time coordinates can be entered in the point and vector model to understand how the property being measured changed over time. This allows the earth model to act as a repository. Time based data is typically difficult to handle but the approach herein provides a manner to handle such data to identify how certain properties evolve over time. This is useful in identifying the effect of measuring flow rate by measuring production over time, temperature of a well bore over time, adding a whole another dimension to the data set.

Figure 1:
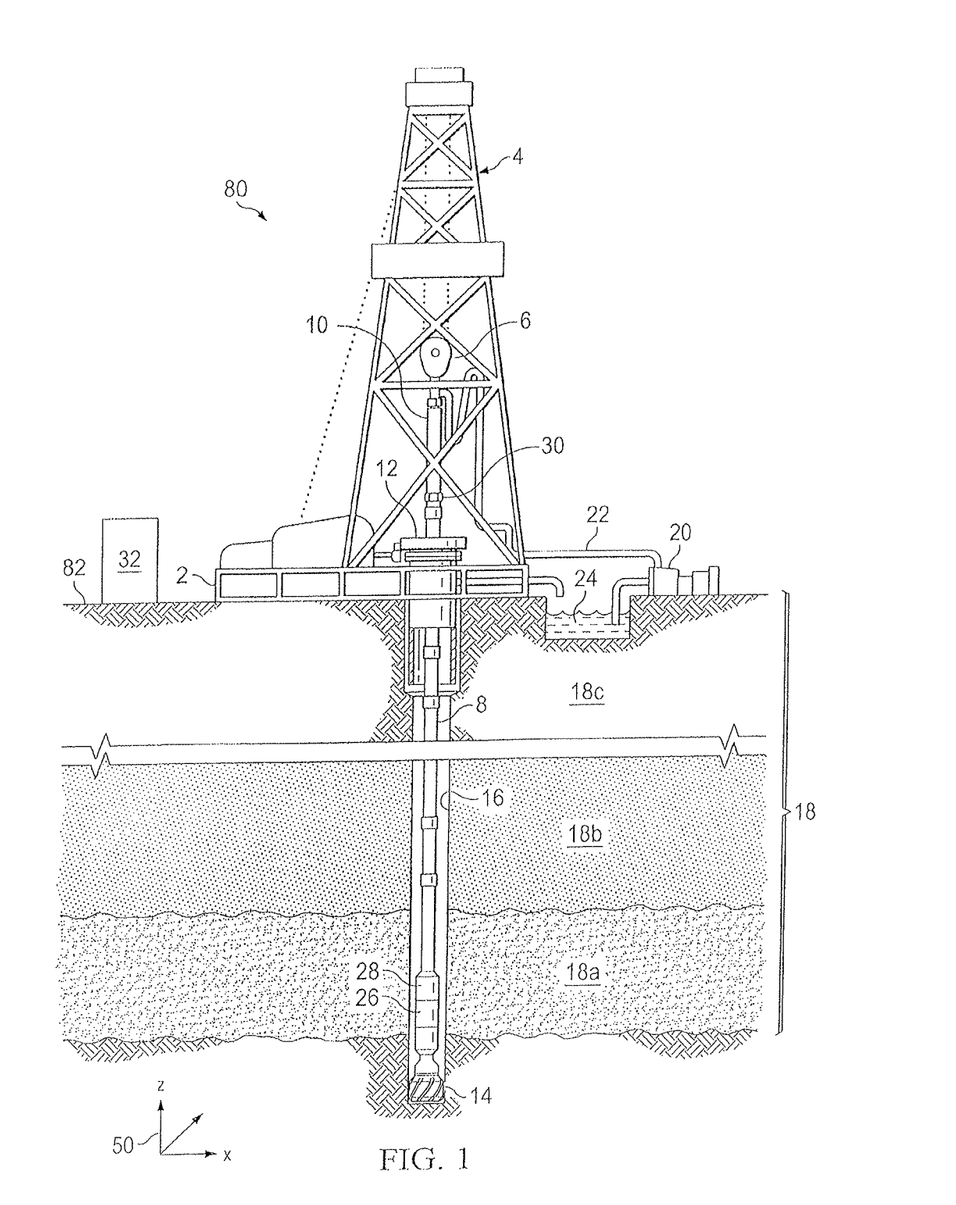
FIG. 1 is a diagram of an example subterranean drilling system, according to aspects of the present disclosure.
Figure 2:
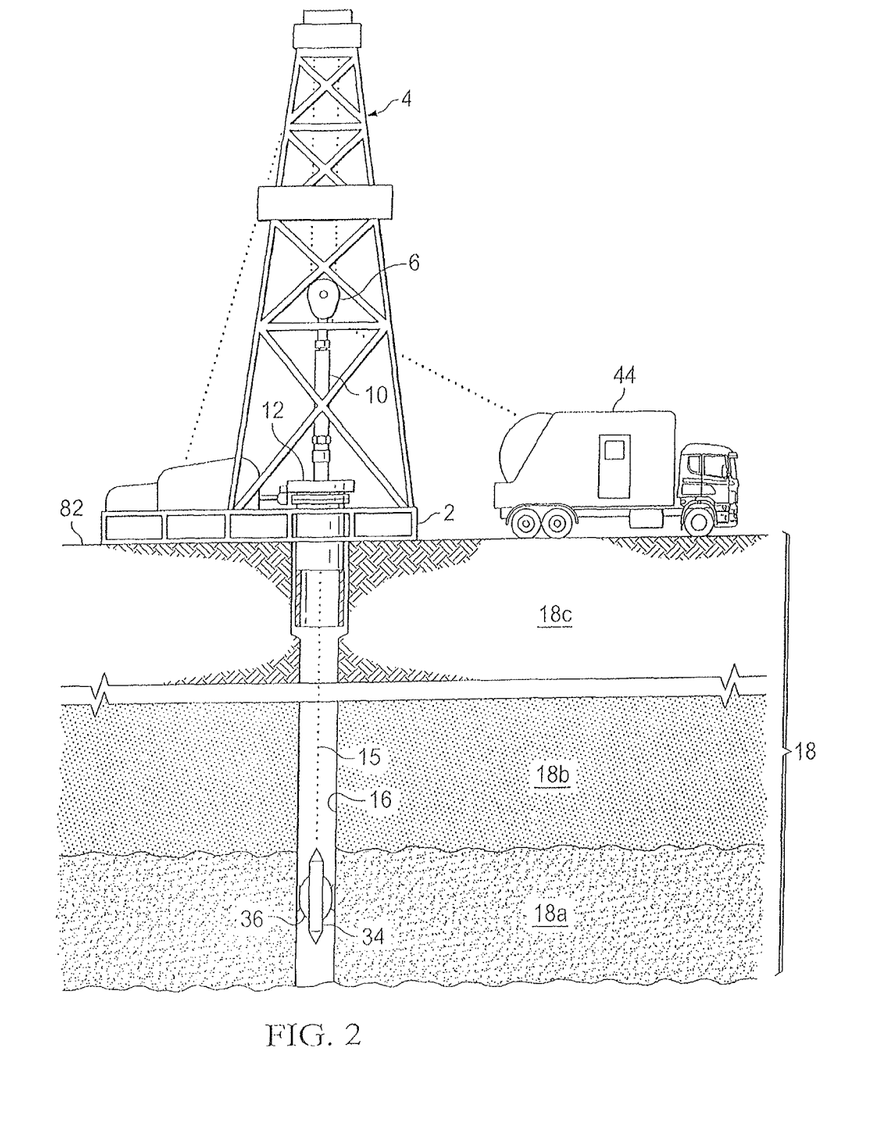
FIG. 2 is a diagram of an example subterranean drilling system with the drill string removed, according to aspects of the present disclosure.

FIGS. 1 and 2 describe a subterranean operation, but the figures are not intended to limit the use of the point and vector model to subterranean drilling systems. The present disclosure is directed to storage of data associated with identifying completion designs based on simulation models and datasets.

FIG. 1 is a diagram of a subterranean drilling system 80, according to aspects of the present disclosure. The drilling system 80 comprises a drilling platform 2 positioned at the surface 82. In the embodiment shown, the surface 82 comprises the top of a formation 18 containing one or more rock strata or layers 18a-c, and the drilling platform 2 may be in contact with the surface 82. In other embodiments, such as in an off-shore drilling operation, the surface 82 may be separated from the drilling platform 2 by a volume of water.

The drilling system 80 comprises a derrick 4 supported by the drilling platform 2 and having a traveling block 6 for raising and lowering a drill string 8. A kelly 10 may support the drill string 8 as it is lowered through a rotary table 12. A drill bit 14 may be coupled to the drill string 8 and driven by a downhole motor and/or rotation of the drill string 8 by the rotary table 12. As bit 14 rotates, it creates a borehole 16 that passes through one or more rock strata or layers 18a-c. A pump 20 may circulate drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole 16 into the pit 24 and aids in maintaining integrity or the borehole 16.

The drilling system 80 may comprise a bottom hole assembly (BHA) coupled to the drill string 8 near the drill bit 14. The BHA may comprise various downhole measurement tools and sensors and LWD and MWD elements, including LWD/MWD tool 26. As the bit extends the borehole 16 through the formations 18, the tool 26 may collect measurements relating to borehole 16 and the formation 18. For example, the tool 26 may include one or more dipole antennas and collect measurements regarding the conductivity, permittivity, permeability, chargeability and other induced polarization parameters of the formation 18. In certain embodiments, the orientation and position of the tool 26 may be tracked using, for example, an azimuthal orientation indicator, which may include magnetometers, inclinometers, and/or accelerometers, though other sensor types such as gyroscopes may be used in some embodiments.

The tools and sensors of the BHA may be communicably coupled to a telemetry element 28. The telemetry element 28 may transfer measurements from tool 26 to a surface receiver 30 and/or to receive commands from the surface receiver 30. The telemetry element 28 may comprise a mud pulse telemetry system, and acoustic telemetry system, a wired communications system, a wireless communications system, or any other type of communications system that would be appreciated by one of ordinary skill in the art in view of this disclosure. In certain embodiments, some or all of the measurements taken at the tool 26 may also be stored within the tool 26 or the telemetry element 28 for later retrieval at the surface 82.

In certain embodiments, the drilling system 80 may comprise a surface control unit 32 positioned at the surface 82. As used herein, a control unit may include an information handling system or any other device that contains at least one processor communicably coupled to a non-transitory computer readable memory device containing a set of instructions that when executed by the processor, cause it to perform certain actions. Example processors include microprocessors, microcontrollers, digital signal processors (DSP), application specific integrated circuits (ASIC), or any other digital or analog circuitry configured to interpret and/or execute program instructions and/or process data. In certain embodiments, the surface control unit 32 may comprise a plurality of information handling systems arranged in a serial or parallel architecture to receive and process downhole measurement data.

In the embodiment shown, the surface control unit 32 is communicably coupled to the surface receiver 30 to receive measurements from the tool 26 and/or transmit commands to the tool 26 though the surface receiver 30. The surface control unit 32 may also receive measurements from the tool 26 when the tool 26 is retrieved at the surface 102. The surface control unit 32 may process some or all of the measurements from the BHA to determine characteristics of the borehole 16 and formation 18, and may also store the raw measurements from the BHA and/or transmit the processed or raw measurements to a data storage facility, such as through a Local Area Network or Wide Area Network. Also shown on FIG. 1 is a coordinate mapping 50 that identifies direction X and Z for the figure.

At various times during the drilling process, the drill string 8 may be removed from the borehole 16 as shown in FIG. 2. Once the drill string 8 has been removed, measurement/logging operations can be conducted using a wireline tool 34, i.e., an instrument that is suspended into the borehole 16 by a cable 15 having conductors for transporting power to the tool and telemetry from the tool body to the surface 102. The wireline tool 34 may comprise a logging tool 36, similar to the tool 26 described above. The tool 36 may be communicatively coupled to the cable 15. A logging facility 44 (shown in FIG. 2 as a truck, although it may be any other structure) may collect measurements from the tool 36, and may include computing facilities (including, e.g., a control unit/information handling system) for controlling, processing, storing, and/or visualizing the measurements gathered by the tool 36. The computing facilities may be communicatively coupled to the tool 36 by way of the cable 15. In certain embodiments, the control unit 32 may serve as the computing facilities of the logging facility 44.

In addition to the measurements described above, other measurements may be generated before, during, and/or after the drilling and completion operations. Examples include, but are not limited to, seismic measurements of the formation 18, measurements related to the physical or chemical composition of fluids trapped within the formation 18 or the drilling fluids used during the drilling operation, measurements related to the physical or chemical composition of the formation 18 itself, and many other measurements that would be appreciated by one of ordinary skill in the art in view of this disclosure. These measurements may be stored and processed locally, such as at a computing facility or control unit, and also may be communicated to a central data repository for storage.

Typically, these measurements, either in raw or processed form, would be stored in a central data repository in relational databases in which the measurements are associated with the reservoir volume to which the measurement corresponds. The reservoir volumes represent three-dimensional subsets of a grid overlaid on the formation. Models of the formation are typically generated with reference to this grid. Due to the localized nature of the grid and reservoir volume, however, it can be computationally prohibitive to generalize the measurements outside of the portion of the formation to which the measurements correspond. This limits the ability to perform reservoir-wide or wider modeling that can be useful for planning drilling operations.

According to aspects of the present disclosure, rather than a grid based model stored in a relational database, the raw or processed measurements may be represented using a point and vector model in a column-oriented database. Grid based models are limited by the number of grid blocks and computational time to solve the model or desired problem can be extensive and limiting. As will be described in detail below, the point and vector model and column-oriented database may facilitate data aggregation and analytics, as well as significantly reduce the computational complexity of extrapolating reservoir-wide or area-wide parameters and properties from the data. For instance, in certain embodiments, a reservoir-wide or even world-wide data model can be generated from point and vector entries in a column-oriented database, from which formation properties can be extrapolated. These properties may include, but are not limited to, petrophysical properties, reservoir properties, geochemistry, reservoir fluid properties, mechanical rock properties, production values, and other properties for which measurements or data may be stored within the column-oriented database.

Column-oriented databases that can be used as part of the embodiments of the present disclosure, for illustrative purposes only, include for example Hadoop HBase or Cassandra, both developed by Apache. Such open source distributed databases are well-suited as part of the framework to implement a database structure for the present invention. Nonetheless, a person of ordinary skill in the art would understand that any non-relational distributed type of database can be used to implement the database to use to implement the point and vector model herein. Moreover, Apache Hadoop as a platform in general is one example of a framework that can be used to implement the bid data approach described herein. These types of column oriented databases, because they essentially consist of gigantic sparse tables, are well-suited to implement the disclosures described herein.

The point and vector model enables extremely large volumes of data to be stored over very large regions. Thereafter, for the solution to a specific problem, volumes of data can be removed and highly refined, regionally specific grinding can be used for modeling and data analysis, opening up improved solution designs and data analysis. The density of the data or resolution is for example handled similar to pixels with each point in space having its key properties assigned.

Figures 3, 4:
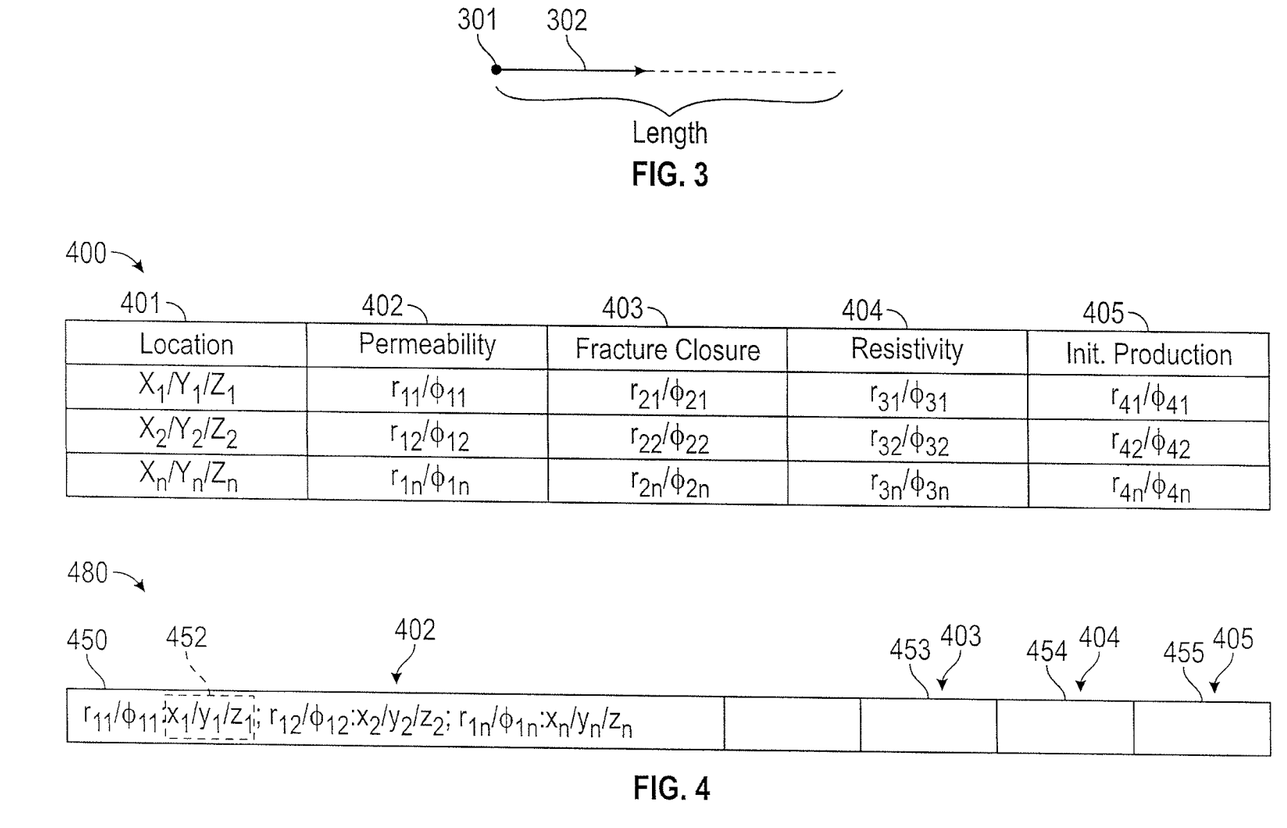
FIG. 3 is a diagram illustrating an example point and vector representation of a data point in a volume of interest, according to aspects of the present disclosure.
FIG. 4 is a diagram illustrating an example table containing point and vector entries for downhole measurements, and an example column-oriented storage scheme for the table, according to aspects of the present disclosure.

FIG. 3 is a diagram illustrating an example point and vector representation of a geological property data point in a volume of interest, such as a formation, according to aspects of the present disclosure. In the embodiment shown, the vector 300 comprises a location, a magnitude, a direction, and a length. The location corresponds to point 301, which may correspond to the physical location to which the data point represented by the vector 300 is associated. For example, in a logging environment during a drilling operation, a logging tool may generate a measurement at a certain depth and location within a borehole. The point 301 may correspond to a specific location or an area from which the measurement was taken or derived. Notably, the point 301 may be associated with more than one vector, to the extent other geological property data points are associated with that location.

The magnitude and direction of the vector 300 are identified by the arrow 302. In certain embodiments, the magnitude of the vector 300 may correspond to the magnitude of the data point represented by the vector 300 (e.g., the geological property in the neighborhood of the location of the point 301), and the direction of the arrow may correspond to the direction of maximum continuity—the direction in which the magnitude of the geological property stays substantially the same for the greatest distance. In this context, substantially the same may mean, for example, within 10 percent, although other meanings are possible depending on the circumstances and the geological property represented by the vector 300. The length 303 may correspond to the distance through the volume-of-interest from the point 301 in the direction of the vector that the point direction of maximum continuity stays substantially the same.

The values of the vectors may be derived from disparate data sources, including the raw and processed measurements described with respect to FIGS. 1 and 2. To the extent not already discussed with reference to FIGS. 1 and 2, the data sources can include, but are not limited to, seismic measurements, log files, microseismic measurements, physics-based-models, and statistics-based-models. Generally, the model-based data may be stored in a substantially similar way to the observed, measured or experimental-based data. This allows for uniformity in the storage of the data, as will be described below, and flexibility to expand the data associated with a given location in order to provide analytical solutions and models based on extrapolations from both the experimental and model based data. Existing data storage typically either stores the experimental and model based data separately and/or in different formats so that combined analytics are computationally difficult.

In certain embodiments, the vector 300 may be represented based, at least in part, on the location of the point 301 and the characteristics of the arrow 302. For example, the point 301 may be identified based, at least in part, on its location within a single coordinate reference system (CRS). In certain embodiments, the single CRS may comprise a geographic coordinate system that identifies a location based on its latitude and longitude on the surface of the Earth, as well as its depth under the surface at that latitude and longitude. The coordinates of the point 301 within the CRS may be measured directly, or calculated and extrapolated from indirect sources. For example, the latitude and longitude of the drilling rig may be known based on a global positioning system at the rig site, and the orientation of the point with respect to the drilling rig may be known from downhole sensors (e.g., accelerometers, magnetometers, etc.) that track the location of the measurement equipment. By combining the absolute position of the drilling rig and the relative position of the measurement equipment when the relevant measurements are taken, the absolute position of the point may be determined.

The arrow 302 may be represented, for example, in polar or rectangular coordinates. Polar coordinates, for instance, may express the magnitude and direction of the arrows 302 in terms of a radial coordinate r and an angular coordinate $\varphi$ with respect to the point 301, respectively. To the extent the direction of the arrow 302 is unknown, the angular coordinate may be left blank, providing flexibility where the data set is incomplete. Rectangular coordinates for the arrow 302 may be expressed in two or three coordinates, for instance, with respect to the point 301.

The representation of the vector of each parameter in polar coordinates serves the added advantage from an application point of view because the direction of the vector may be null, zero, or missing, whereas the magnitude is readily available. If unknown, the direction of maximum continuity could be set to null. The vector direction associated with the point may not always be known leaving at times only the magnitude.

In the case of an earth model scenario, the vectors may be inherited from the stratigraphic surfaces above and/or below the points. Alternatively, vector fields can be created from seismic data, or even created from conceptual information available.

FIG. 4 is a diagram illustrating an example table 400 containing point and vector entries for downhole measurements, and an example column-oriented storage scheme 480 for the table 400, according to aspects of the present disclosure. In the embodiment shown, each row of the table 400 corresponds to measurements associated with a particular point. The associated point may be identified in the first column 401 by its CRS coordinates. In the embodiment shown, the CRS coordinates for each point are represented in the form $x_n/y_n/z_n$, where $x_n$ corresponds to the latitude of the $n^{th}$ point, $y_n$ corresponds to the longitude of the $n^{th}$ point, and $z_n$ corresponds to the depth of the $n^{th}$ point below the surface of the Earth at that $x_n$ and $y_n$ coordinate. It should be appreciated that different points may contain similar values for the latitude, longitude, and depth coordinates based on the location of the point, and that the $x_n$ latitude value is not necessarily different than the $x_{n+1}$ latitude value, for instance.

Each column in the table 400 may correspond to a different type of measurement or value. In the embodiment shown, column 402 corresponds to "Permeability" measurements or values, column 403 corresponds to "Fracture Closure Pressure" measurements or values, column 404 corresponds to "Resistivity" measurements or values, and column 405 corresponds to "90 Day Initial Production" measurements or values. Each entry in a particular column may comprise the polar coordinates of an arrow representing the corresponding measurement or value in the form r/$\varphi$ at the point represented in the corresponding row of column 401. For instance, $r_{11}/\varphi_{11}$ corresponds to the polar coordinates for the arrow representing permeability measurements at point $x_1/y_1/z_1$. Similarly, $r_{3n}/\varphi_{3n}$ corresponds to the polar coordinates for the arrow representing resistivity measurements at point $x_n/y_n/z_n$. To the extent the data entries in a particular column are incomplete—e.g., each point does not have an associated measurement of the type represented in the column, or the associated measurement for a point in incomplete—certain cells or portions of cells may be left blank or otherwise marked as empty.

According to aspects of the present disclosure, the table 400 may be represented in a column-oriented database via a column-oriented storage scheme 480. As used herein, a column-oriented database may be characterized, in part, by the way in which the data from a table is stored on storage media, such as hard disks and other electromagnetic storage devices. In the embodiment shown, each entry in the column 402 is appended with a "primary key" and stored sequentially within a data block 450. An example primary key 452 comprises the CRS coordinates of the point to which the column entry corresponds, although primary keys are not required and other types of primary keys are possible. The data block 450 may be stored on a storage media, such as a hard drive, with a pointer to the beginning of the block 450 stored in an index. In certain embodiments, each subsequent column of data may be similarly appended and sequentially stored in a separate data block. Here, data block 453 corresponds to column 403, data block 454 corresponds to column 404, and data block 455 corresponds to column 405. Notably, the data blocks 450-455 may be stored sequentially within a storage medium, such that only one memory pointer need be maintained, or on separate storage medium, such that a memory pointer for each block is maintained. When columns are added to the table, additional data block may be added in sequence with the existing data blocks, or stored separately with an associated pointer.

As can be seen, once appended with a primary key in the form of the corresponding point's CRS coordinates, each column entry in a given data block will contain both the point and vector data for the corresponding measurement. This data configuration may facilitate easier and faster data computations for analytical database calculations. For instance, if the database user has a query regarding Permeability measurements within a particular formation, only the data block 450 needs to be read from the storage medium, and certain entries may be excluded based on the CRS coordinates of the measurement, without another data block having to be read from the storage media. This is in contrast to a typical row-oriented database, where every row of information would have to be read from the storage medium to identify the relevant Permeability measurements.

The point and vector column-oriented database approach may also facilitate data extrapolation across basin-wide, region-wide, or world-wide areas using measurements and values from various operations and computer modeling. As stated above, the point and vector column-oriented database approach may allow for all of the measurements from remote, unrelated operations and computer modeling to be stored together in a common format, without the need for gridding on other limitations that make combining various measurements computationally difficult. The common format may reduce the computational load needed to perform data analytics and extrapolate information of interest. For example, a user may be interested in modeling or otherwise visualizing measurement values across an entire basin. In those instances, the coordinate boundary of the basin may be determined and used to exclude data entries from outside of the basin of interest. This may include, for example, comparing the x, y, and/or z coordinates of the primary keys with a range of x, y, and/or z coordinates that contain the basin. The basin may then be subdivided into areas or bins based on the CRS coordinates, and the measurements within the database may be associated with a particular bin if the CRS coordinate for that measurement falls within a range of CRS coordinates associated with that bin. The measurements within each bin can then be processed, e.g., to determine an average value for the measurements, and the processed measurements visualized or otherwise used to identify characteristics of interest in the formation. Notably, similar steps may be performed on smaller (e.g., a single formation or layers of depth within a formation) or larger scales (e.g., multiple basins within a region), depending on the particular application.

Figure 5:
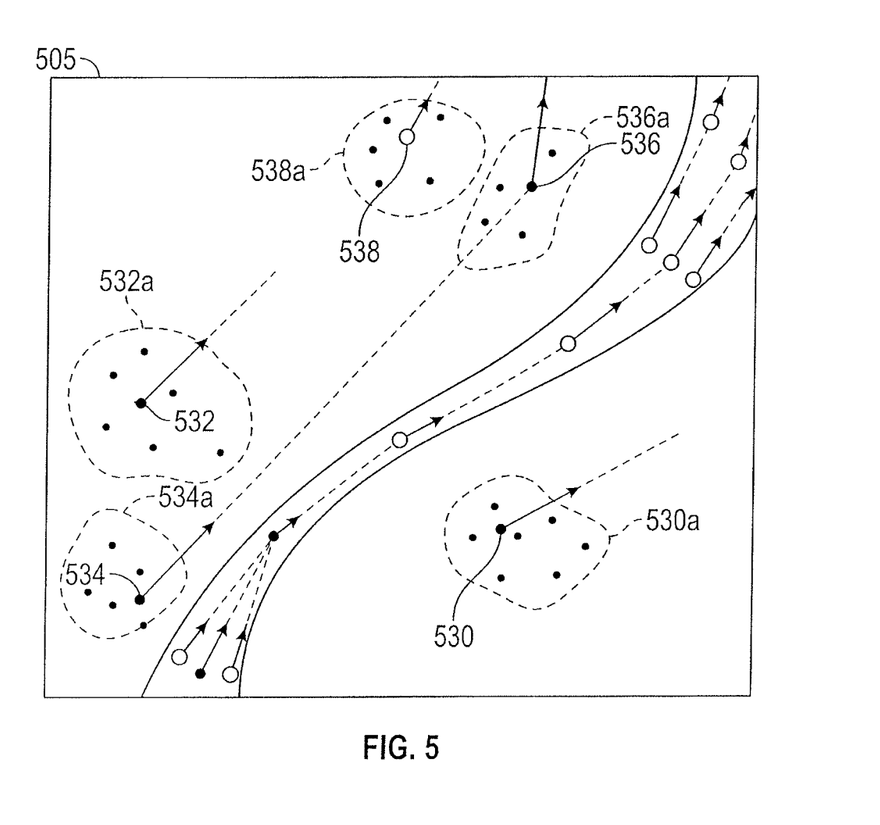
FIG. 5 is an example formation model, according to aspects of the present disclosure.

FIG. 5 is an example formation model generated using steps similar to those described above, according to aspects of the present disclosure. Specifically, an area or volume of interest 505 within a formation may be selected, and the CRS coordinates of that area or volume of interest 505 may be determined. Columns associated with parameters or measurements of interest may then be read from a storage medium, and entries with CRS coordinates outside of the area or volume of interest 505 may be excluded. Once the relevant data entries are identified, representative and or extrapolated points and vectors may be generated from the data entries. For instance, the number and location of points may be determined by analyzing the locations of the points within the data entries, and using one or more clustering algorithms to group the data entries into clusters. In the embodiment shown, the points 530-538 are respectively associated with clusters 530a-538a, with each of the clusters 530a-538a containing a group of points. The locations of the points 530-538 corresponding clusters 530a-538a may be determined, for example, by selecting the average location of the points with the corresponding cluster 530a-538a or performing weighted analysis based on the CRS coordinates of the points. Similarly, the vectors associated with each of the points 530-538 may be determined by averaging, weighted analysis, or other methods that would be appreciated by one of ordinary skill in the art. The other points shown in the model may be generated from similar clustering mechanisms, or may comprise individual data entries representing actual measurements or extrapolations from other modeling operations.

Notably, the model is represented using points and vectors of a form similar to the points and vectors used to store in the raw or processed measurements. Representing the model in this way may facilitate storage of the model results as additional data points within the column-oriented repository. Other types of models, including advanced earth models predicting the performance of a particular oil well or the results of a completion operation, as well as the actual performance of the well or completion operation and the design information used to plan the oilwell and completion operation, may be similarly stored. Locating the models and results within the repository may supplement and improve the data within the repository, as well as allow broader access to the models and results than are typically provided, such as in systems where models are generated and stored locally. The broader access may reduce the computational load to produce subsequent models by leveraging the computational load already used to produce the earlier models.

It is the ability to extract selected volumes and perform the detailed numerical modeling to solve problems and improve well placement and completion designs that generates the point and vector model values that can be used. Extracted volumes from the large dataset can be gridded using highly localized refined gridding solutions to numerically solve complex problems including reservoir simulation and hydraulic fracture creation and propagation.

Figure 6:
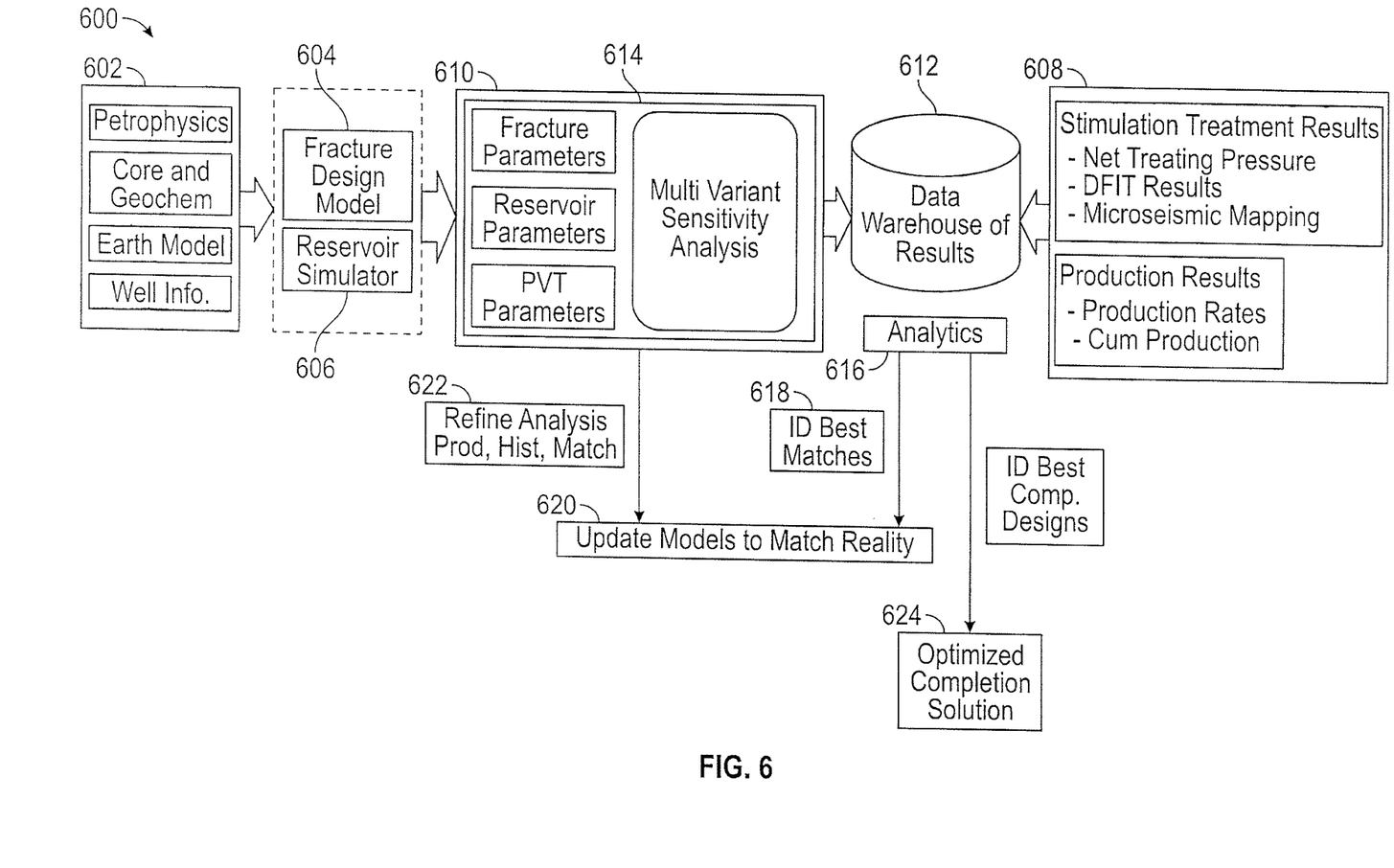
FIG. 6 is a diagram of an example design, calibration, and completion workflow, according to aspects of the present disclosure.

In an example implementation, the combined data repository of models, measurements, and design information can be used to improve the speed and accuracy, and reduce the computational load of a design operation for a new well or completion operations, which are typically labor and computationally intensive and time-consuming. FIG. 6 is a diagram of an example design, calibration, and completion workflow 600, according to aspects of the present disclosure. In the embodiment shown, the workflow may begin with the generation of an earth model 602 that represents the formation/reservoir or the portion of interest of the formation/reservoir. The earth model 602 may comprise a numerical representation of a formation or reservoir that reflects petrophysical and core and geochemical properties of the formation and fluids within the formation/reservoir. Example properties include, but are not limited to, stress profiles, formation permeability, fluid-loss characteristics, the Young's modulus of the formation, principle stress completion, poisson's ratio, brittleness, porosity, fluid saturation, PVT properties, and natural fracture distribution. In certain embodiments, the earth model 602 may be generated by incorporating or otherwise extrapolating or estimating data from existing earth models that were previously generated, including earth models that are stored in a central data repository 612, as described above, as well as generating new earth models based on actual measurements within the repository.

After the earth model 602 is generated, it may be used, in part, in a wellbore and completion design process. This can be focused on a local region with the dataset. The wellbore and completion design process may include the selection of one or more parameters necessary to design the well design and completion operation. One example completion operation comprises hydraulic fracturing, in which pressurized fluids are injected into a formation to cause cracks or fractures in the formation that facilitate hydrocarbon flow into the well. In the embodiment shown, the completion design process comprises a fracture design model 604 that estimates the characteristics of the propagation of hydraulic fractures within a given formation, as well as the characteristics of the fluid to pump downhole to create the hydraulic fracture.

In some embodiments, the disclosure herein is applicable to develop an improved wellbore or completion design for a fracturing operation. Typically, at a wellbore, fracturing fluid is applied to a portion of the subterranean formation surrounding a portion of the well bore. The well bore may include horizontal, vertical, slant, curved, and other types of well bore geometries and orientations, and the fracturing treatment may be applied to a subterranean zone surrounding any portion of the well bore.

The well bore can include a casing that is cemented or otherwise secured to the well bore wall. The well bore can be uncased or include uncased sections. Perforations can be formed in the casing to allow fracturing fluids and/or other materials to flow into the subterranean formation. In cased wells, perforations can be formed using shape charges, a perforating gun, hydro jetting and/or other tools.

The well can have a work string into the well bore 104. A system that pumps fracturing fluid can be coupled to the well bore through the work string. The working string may include coiled tubing, jointed pipe, and/or other structures that allow fluid to flow into the well bore. The working string may include ports that are spaced apart from the well bore wall to communicate the fracturing fluid into an annulus in the well bore between the working string and the well bore wall.

The fracturing operation thus involves several parts and resources that can be improved by using the present invention. For example, the present disclosure can be used to simulate a fracturing operation at the well bore. The fracturing operation can include a number of characteristics and variables, each of which (or a subset) can be included within the software and saved for reference as disclosed herein. Thereafter, for a particular fracturing operation, a user can insert those characteristics of the well bore to generate a simulation or simulations of fracturing operations for optimal assessment of the operation for the well bore.

Once the parameters and characteristics of the formation and fractures are respectively modeled and estimated in the earth model 602 and fracture design model 604, those parameters and characteristics may be incorporated into a reservoir simulator 606. The reservoir simulator may, for instance, simulate the completion operation to determine its effectiveness at fracturing the formation, as well as simulate the resulting production from the formation due to the fracturing operation. In the embodiment shown, the results of the reservoir simulation 608 as well as the parameters 610 used within the reservoir simulator may be stored in a central repository 612. Example parameters 610 include, but are not limited to, fracture parameters, reservoir parameters, and pressure, volume, and temperature parameters. The central repository 612 may also include parameters and results generated through previous design operations on different wells across many different formations and reservoirs. This will allow the central repository 112 to house parameters and results generated through previous design operations for all past operations, making these usable in further analysis and design.

In order to improve the resulting completion operation, sensitivity analyses 614 may be run to evaluate uncertainties in the local models in the estimated variables, such as formation permeability and drainage area, formation stress, fracture propagation, etc. In certain instances, numerical or analytical analysis 616 may be run on data within the central repository 612 to find the optimal match 618 or reasonable group of responses for the values of the estimated variables. The values of the parameters 610 may then be changed to reflect to best match 618 values at 620, and the simulation re-run. The new simulation results and parameters may again be saved to the central repository 612, and the sensitivity analyses 614 may be re-run to evaluate uncertainties. This process may continue until the uncertainties within the simulated data are within an acceptable tolerance range, at which point, the optimized completion solution 624 may be reached.

Once well performance can be captured based on the implementation of the completion solution 624, the data resulting from the well performance can be used to validate and enable the modelled results to be compared to the actual output. This will enable self-validation of the generated models to verify the quality of the predictions, which can then be updated in the central repository for further use and analysis.

Figure 7:
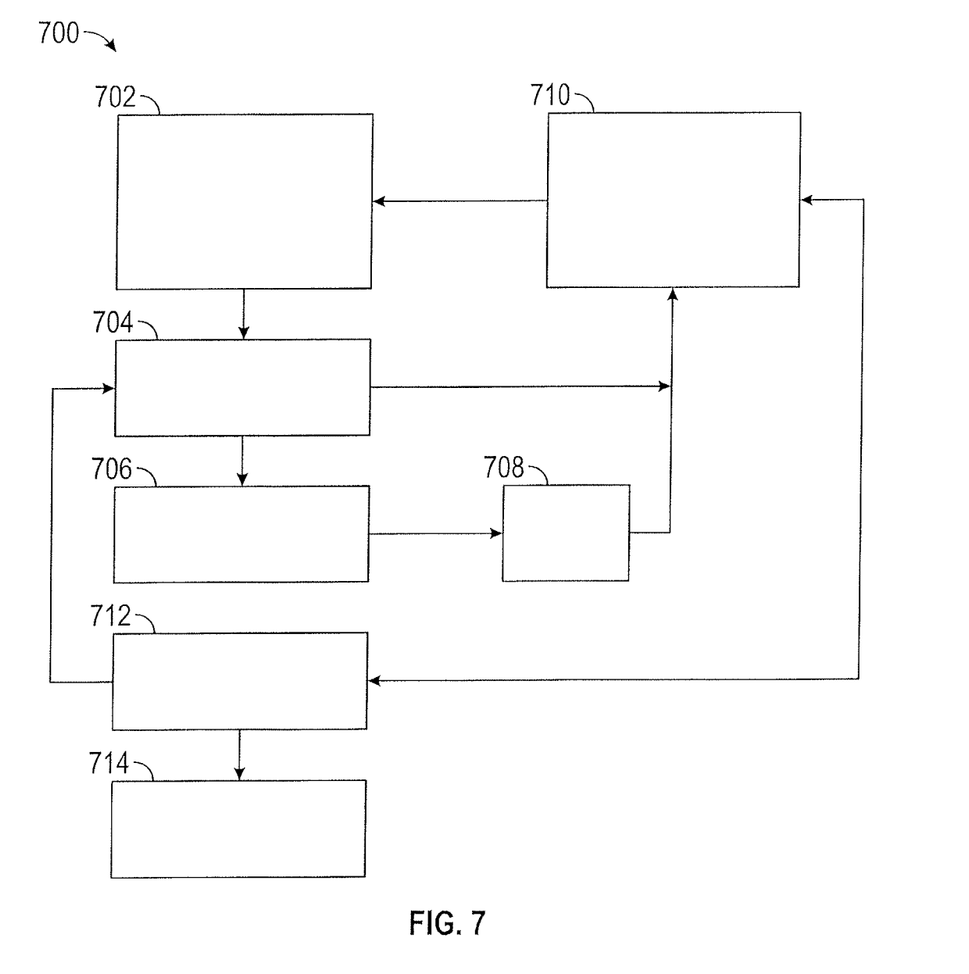
FIG. 7 is an example flow diagram illustrating an example at least partially automated design process, according to aspects of the present disclosure.

In certain embodiments, the central data repository can be further leveraged to at least partially automate the design process. Specifically, one or more machine learning algorithms may use the design and simulation data as well as the actual measurements and model predictions within the repository to provide a starting point for design operations, thereby providing a simpler and faster way to complete a design process directly from mathematical models. FIG. 7 is an example flow diagram illustrating an example at least partially automated design process, according to aspects of the present disclosure. At step 700, a user may input one or more parameters into a design tool 702. The parameters may include, for example, the type of formation, or the location of the formation of interest. The design tool may receive the input 702 and output suggested design and formation/reservoir parameters 704. Those parameters may be used in a reservoir simulator 706, as described above, to produce simulation results 708, with the suggested parameters 704 and the simulation results 708 being stored in a central repository 710. Analytic analysis may be run to improve the suggested parameter values and reduce the uncertainty in the models, with the process being iteratively repeated until an optimized design solution 714 is output, similar to the process described above with respect to FIG. 6

In the embodiment shown, the design tool 702 may include or result from one or more machine learning algorithms. Example machine learning algorithms include, but are not limited to, decision trees, artificial neural networks, support vector machines, and Bayesian networks. In certain embodiments, the machine learning algorithm may receive both actual measurements, modeled and design parameters, and simulation results and measured post treatment performance from the repository 710, which may but are not required to be stored in the repository 710 in a point and vector format. The machine learning algorithm may, for instance, compare the actual measurements to the modeled parameters to generate new, more accurate models. These models may be used as a basis from which a user may work when inputting the parameters 700, or a model may be selected by the design tool 702 for the user based on the parameters 700. Similarly, the machine learning algorithm may compare actual measurements of the simulation and completion results within the repository 710 to improve the reservoir simulation and reduce the uncertainty of the variables used within the reservoir simulation. Based on the above, in certain embodiments, the design tool 702 may suggest certain design parameters with relatively lower uncertainties as a starting point of the iterative process. This may reduce the number of iterations needed to find an optimum solution, which saves time and computing resources. Additionally, the parameters suggested by the design tool may improve over time due to the suggested parameters being stored in the database with the other data, such that the machine learning algorithm may further improve the accuracy of the models over time. In certain cases, the improved modeling by the machine learning algorithm may result in initial suggested parameters that provide optimum or near-optimum solutions such that the iterative process can be avoided entirely.

In addition to implementing the present invention in an information handling system, to implement the present invention, in one embodiment, one could use server farms to store the data across multiple platforms, servers, or information handling systems. In addition to server farms, cloud computing could also be used as understood by one of skill in the art to implement the present invention.

Therefore, the present disclosure is well-adapted to carry out the objects and attain the ends and advantages mentioned as well as those which are inherent therein. While the disclosure has been depicted and described by reference to exemplary embodiments of the disclosure, such a reference does not imply a limitation on the disclosure, and no such limitation is to be inferred. The disclosure is capable of considerable modification, alteration, and equivalents in form and function, as will occur to those ordinarily skilled in the pertinent arts and having the benefit of this disclosure. The depicted and described embodiments of the disclosure are exemplary only, and are not exhaustive of the scope of the disclosure. Consequently, the disclosure is intended to be limited only by the spirit and scope of the appended claims, giving full cognizance to equivalents in all respects. The terms in the claims have their plain, ordinary meaning unless otherwise explicitly and clearly defined by the patentee.

What is claimed is:

1. A method, comprising:
representing, by a plurality of point and vector representations in a column-oriented repository of an information handling system, a set of measurements corresponding to one or more of one or more formations, one or more reservoirs, or one or more wellbores, wherein the plurality of point and vector representations comprise one or more points and one or more vectors;
associating a physical location with a measurement of the set of measurements, wherein the physical location is represented by a point and vector representation of the plurality of point and vector representations as a point of the one or more points, wherein the point is associated with at least one of the one or more vectors of the plurality of point and vector representations, and wherein each column of the column-oriented repository corresponds to a different type of measurement of the set of measurements;
wherein the plurality of point and vector representations comprise at least a magnitude and a direction derived from the measurement;
wherein the magnitude and direction tracks the physical location in space and time;
appending a key to each entry of each column of the column-oriented repository, wherein the key comprises coordinates of each of the one or points to which each entry of each column corresponds; and
generating a model based on one or more columns of the column-oriented repository corresponding to a type of measurement of interest of the plurality of the point and vector representations.

2. The method of claim 1, wherein the physical location comprises a location in a single coordinate reference system.

3. The method of claim 2, wherein the physical location comprises longitude, latitude, and depth coordinates in a geographic coordinate system.

4. The method of claim 1, wherein the direction of at least one of the one or more vectors of the plurality of point and vector representations is null value.

5. The method of claim 1, wherein the magnitude comprises a value of the measurement of the set of measurements from which the point and vector representation is derived, and the direction comprises the direction in which the magnitude of the measurement stays the same for the greatest distance.

6. The method of claim 5, wherein the point and vector representation comprises radial coordinates and angular coordinates in a polar coordinate system.

7. The method of claim 5, wherein the point and vector representation further comprises a length, wherein the length of the point and vector representation comprises the distance for which the magnitude of the measurement stays the same.

8. The method of claim 1, further comprising storing each column of the column-oriented repository in separate sequential data blocks.

9. The method of claim 1, wherein the set of measurements comprise one or more of one or more actual measurements, one or more formation models, one or more formation simulation results, and one or more design parameters.

10. The method of claim 9, further comprising generating at least one model based, at least in part, on the representations of at least one or more of the measurements of the set of measurements within the column-oriented repository.

11. The method of claim 10, further comprising representing the at least one model in the column-oriented repository based, at least in part, on physical locations and vector representations of data within the at least one model.

12. A non-transitory, computer readable medium comprising a set of instructions that, when executed by a processor, cause the processor to perform the steps of:
representing, by a plurality of point and vector representations in a column-oriented repository, a set of measurements corresponding to one or more of one or more formations, one or more reservoirs, or one or more wellbores, wherein the plurality of point and vector representations comprise one or more points and one or more vectors;
associating a physical location with a measurement of the set of measurements, wherein the physical location is represented by a point and vector representation of the plurality of point and vector representations as a point of the one or more points, wherein the point is associated with at least one of the one or more vectors of the plurality of point and vector representations, and wherein each column of the column-oriented repository corresponds to a different type of measurement of the set of measurements;
wherein the plurality of point and vector representations comprise at least a magnitude and a direction derived from the measurement;
wherein the magnitude and direction tracks the physical location in space and time;
appending a key to each entry of each column of the column-oriented repository, wherein the key comprises coordinates of each of the one or points to which each entry of each column corresponds; and
generating a model based on one or more columns of the column-oriented repository corresponding to a type of measurement of interest of the plurality of the point and vector representations.

13. The non-transitory, computer readable medium of claim 12, wherein the physical location comprises a location in a single coordinate reference system.

14. The non-transitory, computer readable medium of claim 13, wherein the physical location comprises longitude, latitude, and depth coordinates in a geographic coordinate system.

15. The non-transitory, computer readable medium of claim 12, wherein the direction of at least one of the one or more vectors of the plurality of point and vector representations is null value.

16. The non-transitory, computer readable medium of claim 12, wherein the magnitude comprises a value of the measurement of the set of measurements from which the point and vector representation is derived, and the direction comprises the direction in which the magnitude of the measurement stays the same for the greatest distance.

17. The non-transitory, computer readable medium of claim 16, wherein the point and vector representation comprises radial coordinates and angular coordinates in a polar coordinate system.

18. The non-transitory, computer readable medium of claim 16, wherein the point and vector representation further comprises a length, wherein the length of the point and vector representation comprises the distance for which the magnitude of the measurement stays the same.

19. The non-transitory, computer readable medium of claim 12, further comprising storing each column of the column-oriented repository in separate sequential data blocks.

20. The non-transitory, computer readable medium of claim 12, wherein the set of measurements comprise one or more of one or more actual measurements, one or more formation models, one or more formation simulation results, and one or more design parameters.

21. The non-transitory, computer readable medium of claim 20, further comprising generating at least one model based, at least in part, on the representations of at least one or more of the measurements of the set of measurements within the column-oriented repository.

22. The non-transitory, computer readable medium of claim 21, further comprising storing each column of the column-oriented repository in separate sequential data blocks.

* * * * *